United States Patent [19]

Song et al.

[11] Patent Number: 5,776,799

[45] Date of Patent: Jul. 7, 1998

[54] LEAD-ON-CHIP TYPE SEMICONDUCTOR CHIP PACKAGE USING AN ADHESIVE DEPOSITED ON CHIP ACTIVE SURFACES AT A WAFER LEVEL AND METHOD FOR MANUFACTURING SAME

[75] Inventors: Young-Jae Song, Seongnam; Jeong-Woo Seo, Suwon; Kyung-Seop Kim, Seoul, all of Rep. of Korea

[73] Assignee: Samsung Electronics Co., Ltd., Suwon, Rep. of Korea

[21] Appl. No.: 745,358

[22] Filed: Nov. 8, 1996

[51] Int. Cl.⁶ .................................................. H01L 21/60
[52] U.S. Cl. ........................ 438/118; 438/111; 438/123
[58] Field of Search ........................... 438/110, 111, 438/112, 113, 114, 123, 124, 118

[56] References Cited

U.S. PATENT DOCUMENTS

| | | |
|---|---|---|
| 4,796,078 | 1/1989 | Phelps, Jr. et al. |
| 4,862,245 | 8/1989 | Pashby et al. |
| 4,989,068 | 1/1991 | Yasuhara et al. |
| 5,086,018 | 2/1992 | Conru et al. ............ 438/118 |
| 5,221,642 | 6/1993 | Burns |
| 5,227,661 | 7/1993 | Heinen |
| 5,535,509 | 7/1996 | Tomita et al. ............ 438/118 |
| 5,627,108 | 5/1997 | Alibocos et al. ............ 438/118 |

*Primary Examiner*—Kevin Picardat
*Attorney, Agent, or Firm*—Jones & Volentine, L.L.P.

[57] ABSTRACT

A lead-on-chip package manufacturing method includes an insulating liquid adhesive depositing step on lead attaching regions formed on an active surface of a semiconductor on a wafer. The adhesive deposition may be accomplished by a screen printing method in which the adhesive is forced through hole patterns of a metal screen, or by a dispensing method in which a liquid adhesive is dispensed from needles of a dispensing head that is movable over the wafer surface and is aligned with the wafer. The dispensing technique may be applied to a plurality of chips in step-by-step fashion, or in a simultaneous manner by using a multi-needled dispensing head.

16 Claims, 11 Drawing Sheets

5,776,799

1

LEAD-ON-CHIP TYPE SEMICONDUCTOR CHIP PACKAGE USING AN ADHESIVE DEPOSITED ON CHIP ACTIVE SURFACES AT A WAFER LEVEL AND METHOD FOR MANUFACTURING SAME

BACKGROUND OF THE INVENTION

1. Field of the Invention

The present invention generally relates to a LOC (Lead On Chip) type semiconductor chip package, and more particularly to a LOC type package in which an adhesive for bonding a semiconductor chip to lead frame leads is formed by depositing lead attaching regions on an active surface of a semiconductor at the wafer level, and to a method for manufacturing the same.

2. Description of the Related Arts

In a LOC type semiconductor chip package, the semiconductor chip is attached to a lead portion of a lead frame rather than to a lead frame pad (also refereed to as 'die pad'). Because the lead frame leads must be electrically coupled to the semiconductor chip, inner leads of the lead frame are attached to an active surface of the chip where desired circuit elements and a plurality of electrode pads are formed. Accordingly, the leads lie over the chip, as shown in FIG. 1A.

Referring to FIG. 1A, a copper-alloy or iron-alloy lead frame 10 provided with inner leads 12, outer leads 14 and bus bars 16 is coupled to the upper surface of a semiconductor chip 20 by adhesives 30. The adhesives 30 are for attaching the inner leads 12 and the bus bars 16 to active surface 24 on which electrode pads 22 are formed, and render the chip to be supported by the lead frame during the assembly process for the chip.

The inner leads 12 and the electrode pads 22 are, as shown in FIG. 1B, electrically coupled by gold or aluminum wires 40. The bus bars 16 stabilize the power supply for the chip. When a protective package body 50 is completed, and the outer leads 14 protruding from the package body are formed into a proper configuration, e.g., a J-shape, a LOC semiconductor chip package is obtained.

In the LOC technology, it is possible to enhance the ratio of the size of the semiconductor chip and the size of the package, and therefore to realize smaller packaged devices. For instance, the ratio of the package to chip size is up to 60% in a standard package device, and 70% in a COL (Chip On Lead) device, while the ratio can be as high as 90% in a LOC type package. Moreover, in the LOC package, the deterioration of a device reliability due to differences of physical properties between different materials (for example, the difference of a thermal coefficient of expansion between the package body and the lead frame) can be prevented, because a lead frame pad is not employed. For these advantages, the LOC packaging technology is widely used by the present semiconductor manufacturers.

The adhesive 30 is, in general, a polyimide based double sided adhesive tape, for example, a double sided thermosetting epoxy adhesive coated polyimide film, and the production process thereof is as follows. First, a liquid adhesive material is uniformly deposited on one surface of the polyimide film. The deposited liquid adhesive is cured into a B-stage (i.e., a semi-solid state) adhesive. The other surface of the polyimide film is then subjected to the same deposition and the curing steps. This adhesive deposited polyimide tape is tailored to have a desired width and then provided for a die bonding process in which the semiconductor chip is bonded to the lead frame.

2

FIGS. 2A to 2C schematically show the processes for attaching a semiconductor chip to a lead frame by using the polyimide tape. The lead frame 10, comprising inner leads 12 and bus bars 16, and the adhesive tape 30 are heated to about 200° to 400° C. by a heater 60, and compressed together by a punching machine 70 so that the tape can be attached to the lead frame. At this time, the punching machine 70 cuts off the unnecessary part of the tape depending on the shape of the lead frame used. The semiconductor chip 20 is then placed on a heater block 80 and the polyimide tape is attached to the active surface of the chip.

The conventional LOC type package has the following drawbacks: first, the three layered polyimide adhesive tape is provided by a complicated production process leading to an increase in the production costs. Also, there is a critical need to reduce the thickness of the adhesive tape.

Second, since the tape is attached to the lead frame leads by using a mechanical tool such as the punching machine, the minimum size of the adhesive tape is determined by the working limit of the machine, and burrs may be formed at the punched edges of the tape which would cause some problems during subsequent assembly processes.

Third, because the polyimide tape contacts several different materials such as the lead frame, semiconductor chip, and plastic package body, thermal stress resulting from the mismatches of TCEs (Thermal Coefficient of Expansion) of the different materials, during for example, reliability tests carried out under hot and humid environment, is a potential cause of the device failure. Furthermore, when the conventional LOC package is mounted on a external system board by soldering, the package body can be cracked due to the fact that the adhesive material, as well as the polyimide film, has a high water absorption property.

Accordingly, there has been a need to develop schemes to reduce the production cost of the LOC type package and to reduce the size and the thickness of the adhesive for improving the reliability of the LOC type package.

SUMMARY OF THE INVENTION

It is an object of the present invention to provide a method for producing a LOC type semiconductor chip package with lower cost.

It is another object of the present invention to improve the reliability of a LOC type semiconductor chip package.

According to the manufacturing method of LOC type package of the present invention, an adhesive tape is not used when the lead frame leads and the chip are bonded. Instead, an adhesive deposition step is applied to active surfaces of semiconductor chips in a wafer state before the semiconductor chips are completely separated from the wafer.

In the adhesive deposition step, an electrically insulating liquid adhesive such as polyimide, epoxy, polyimide siloxane, and polyether amide is deposited on lead attaching regions of the chip active surface where lead frame leads are to be placed in a future die bonding process, and then partly cured into a B-stage adhesive layer. In order to prevent the overflow of the deposited liquid adhesive, the lead attaching regions are made to have a grooved shape. The grooved lead attaching regions can be obtained by using a photo-mask that was originally used for making the electrode pads to be opened from a protection layer formed on the entire surface of a wafer.

The wafer level adhesive deposition can be accomplished either by a screen printing technique in which a metal screen with required patterns corresponding to the lead attaching regions is pressed against the wafer surface and then a liquid adhesive is forced through the patterns using a squeegee, or by a dispensing technique in which a liquid adhesive is dispensed from needles of a dispensing head that is movable over the wafer surface and is aligned with the wafer.

In case of the dispensing method, the dispensing may be applied to a plurality of chips in a step-by-step process, or in a mass process, for example, by using multi-needled dispensing head.

DETAILED DESCRIPTION OF THE PRESENT INVENTION

Figure 1A:
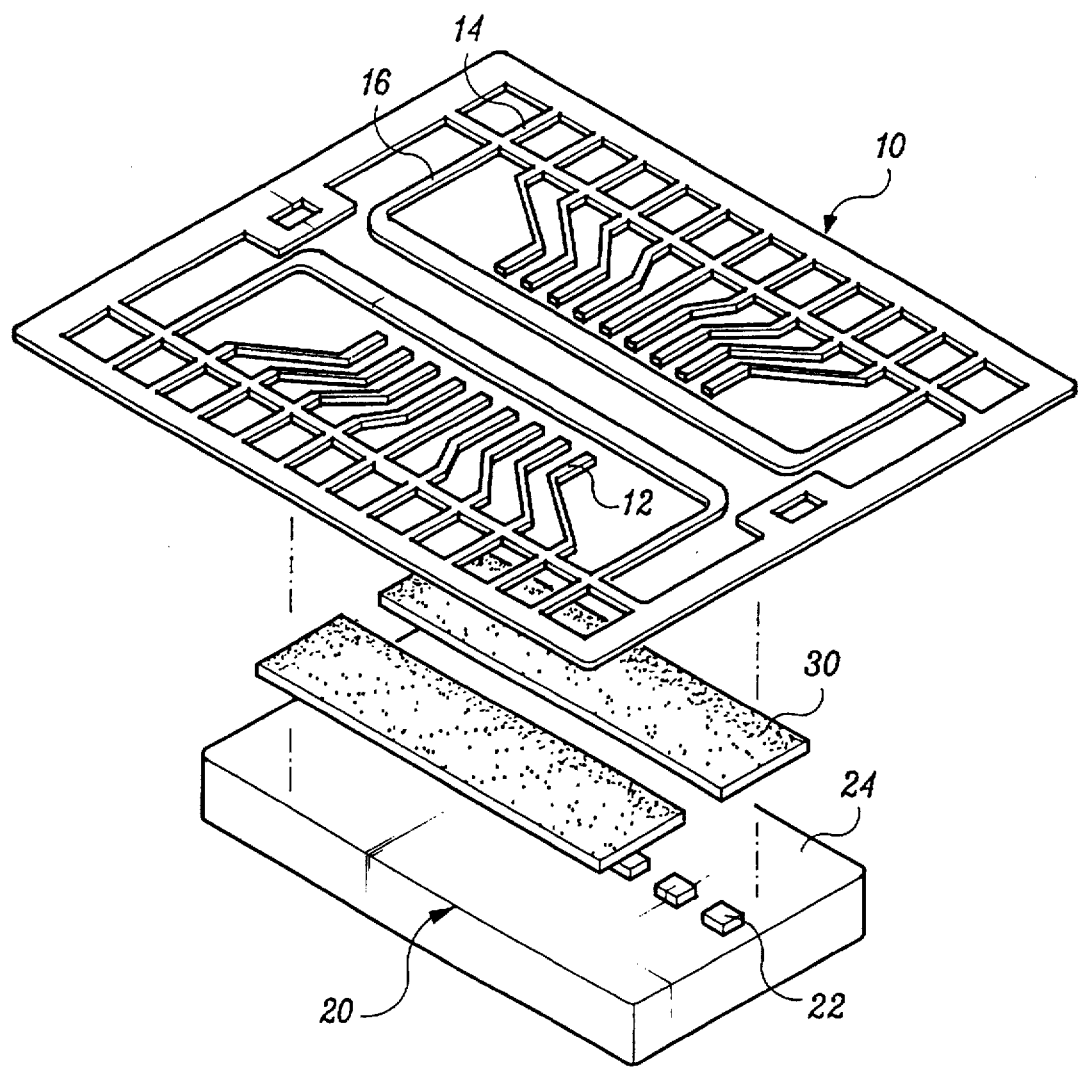
FIGS. 1A and 1B are perspective and front cross section views for showing the structure of a conventional LOC type chip package, respectively.
Figure 1B:
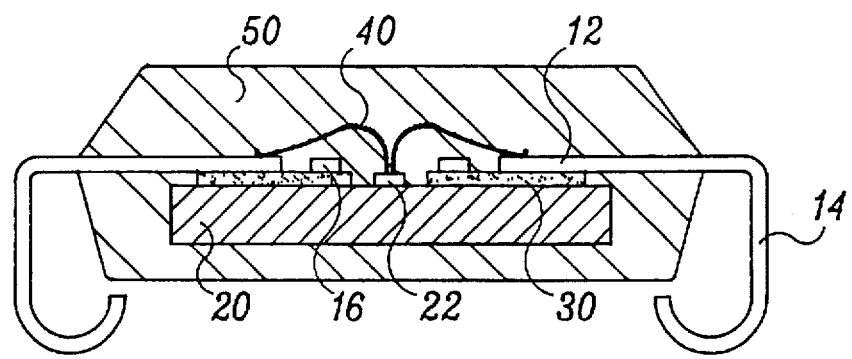
Figure 2A:
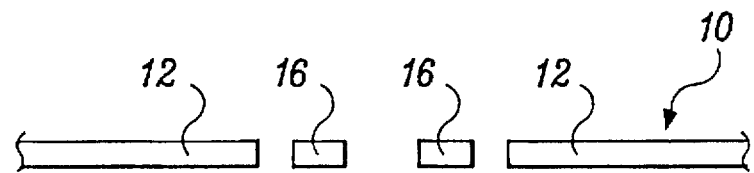
FIGS. 2A to 2C are partial cross sectional views for showing the conventional process of attaching a lead frame to an active surface of a semiconductor chip by using a polyimide adhesive tape.
Figure 2B:
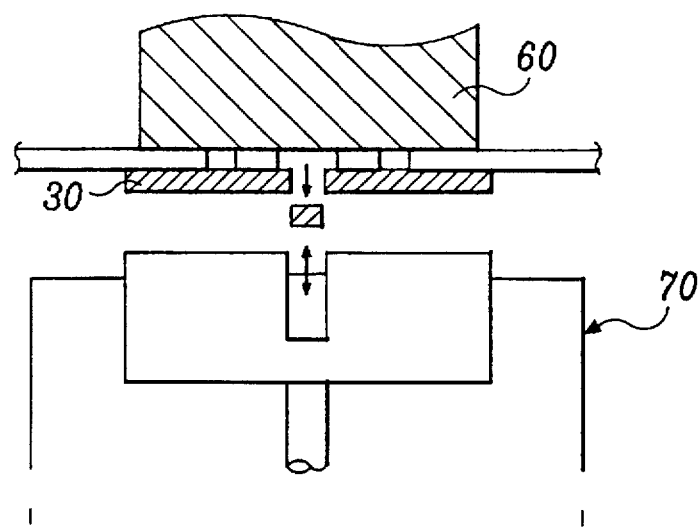
Figure 2C:
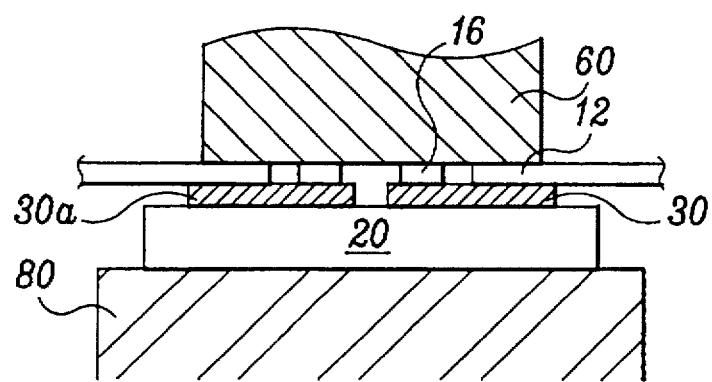
Figure 3:
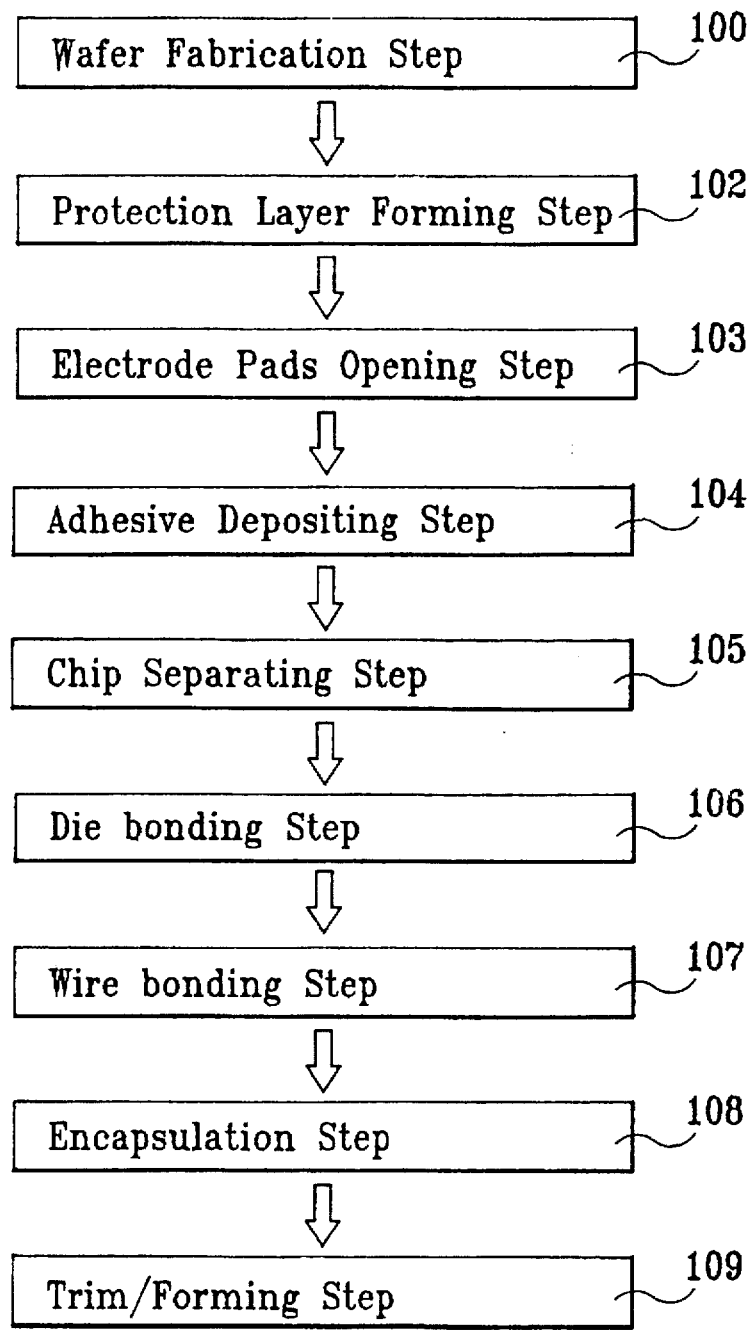
FIG. 3 is a flow chart of a manufacturing process of the LOC type chip package according to the present invention.

A method for manufacturing a LOC type chip package of the present invention fundamentally follows the processing steps shown in FIG. 3. In wafer fabrication step 100, a plurality of semiconductor integrated circuit chips having desired functions and capacities are fabricated by batch processes. The semiconductor chips which are used in a LOC type package have electrode pads disposed in a central region of an active surface on which lead frame leads are to be attached.

After the wafer fabrication step 100, a protection layer is deposited on the wafer surface in step 102. The protection layer may be either a passivation layer typically coated on the wafer or a passivation layer and a polyimide layer coated on the passivation layer. The polyimide coating layer is widely used due to the fact that it can effectively protect the active surface during a back lapping process in which the back side of the wafer is ground in order to make the wafer thinner, and can play the role of protecting the wafer surface in the molding process for forming the package body. In addition, with the polyimide coating, it can be expected that an SER (Soft Error Ratio) resulted from an alpha particle emitted from the package body is significantly reduced. Typically, the polyimide layer is coated on the wafer by a spin coating method.

When the protection layer is deposited on the wafer, electrode pads of the semiconductor chip must be opened, because the electrode pads, which are the medium for electrically communicating the chip with the external world, should be bonded to lead frame leads in a wire bonding step. In step 103, the electrode pad openings can be accomplished by using a traditional photo-etching method. In the meantime, as will be explained below, when opening the electrode pads, it is preferable to open lead attaching regions having a grooved shape on which an adhesive material is deposited according to the present invention on the active surface of the chip.

After an adhesive is deposited in step 104 on the lead attaching regions of the protection layer deposited on the wafer surface, the plurality of semiconductor chips are individually separated from the wafer in step 105. The separated chips are attached to lead frame leads in step 106. The separated chips are called die, and therefore step 106 is called a die bonding step. The die bonding step of the present invention does not use any additional adhesive tape but utilizes the adhesive deposited during the step 104.

The subsequent processes are similar to conventional assembly processes: a wire bonding step 107 for electrically interconnecting the lead frame leads and the electrode pads of the chips; an encapsulation step 108 for making a protective package body; and a trim/forming step 109 for cutting and trimming the package body and leads from the rest of the lead frame strip and for bending lead portions protruding from the package body.

Figure 4A:
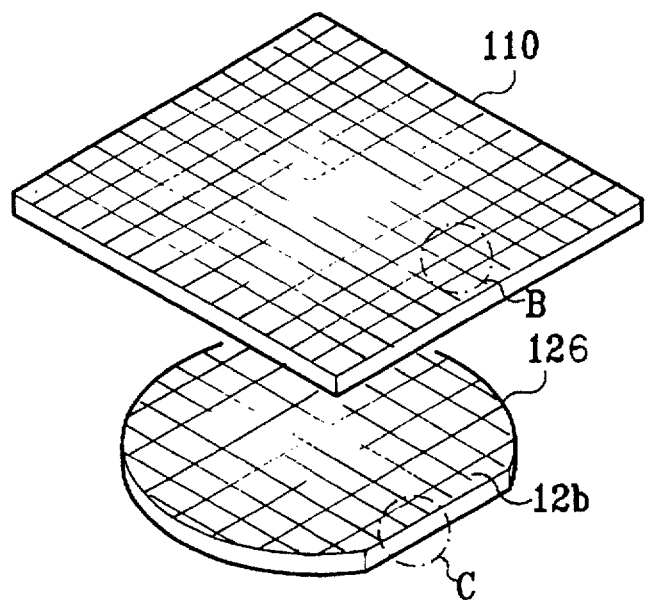
FIG. 4A is a perspective view of a photo mask used to open electrode pads and to form grooved lead attaching regions according to the present invention on a wafer surface deposited with a protection layer.
Figure 4B:
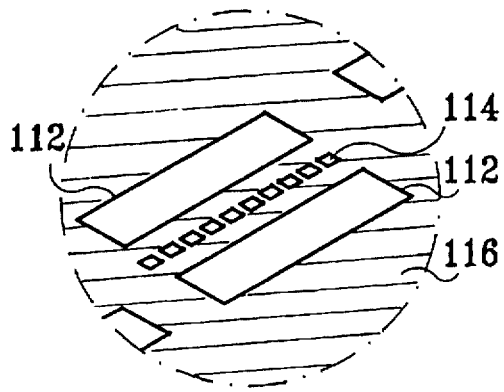
FIG. 4B is a partial enlarged view of portion B of the photo mask having patterns of the electrode pads and the lead attaching regions.
Figure 4C:
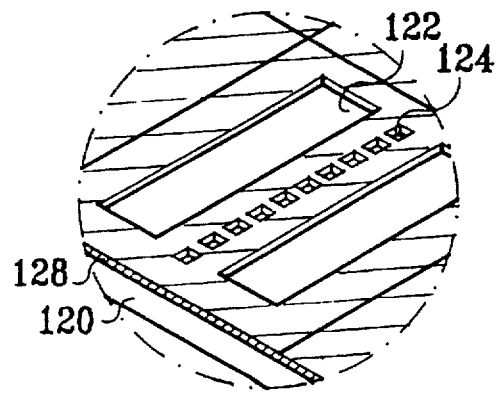
FIG. 4C is a partial enlarged view of portion C of the chip active surface where openings for the electrode pads and lead attaching regions formed as grooves are completed.

FIGS. 4A to 4C shows the grooved lead attaching regions formed on the active surface according to the present invention. The grooved regions are formed in the electrode pad opening step 103 of FIG. 3. Electrode pads opening regions 124 and the lead attaching regions 122 may be obtained by employing a photo-mask 110 generally used in a conventional photolithography technique. On a glass plate, predetermined patterns of, for example, a chromium are formed. These patterns include a lead attaching region pattern 112 and a electrode pad opening pattern 114. A photoresit is deposited on the entire wafer surface on which the protection layer 128 has been deposited. The patterned mask 110 is placed over and aligned with the wafer 120. When the wafer surface is exposed via the mask to a light such as UV light, the photoresist is partly exposed depending on the mask patterns, and the chemical property of the photoresist is changed. By emerging the wafer into a development solution, the changed part is eliminated and so the protection layer is partly exposed. When the exposed protection layer portion is etched away, the lead attaching regions 122 and the pad opening regions 124 can be obtained as shown in FIG. 4C. Since the lead attaching regions 122 have a grooved shape, it is possible to protect the overflow of an adhesive when the adhesive is deposited on these regions 122 according to the present invention. However, it should be noted that the grooved lead attaching region is not essential in the present invention, and therefore the adhesive can be deposited directly on the protection layer if the locations are correct.

Several approaches may be adopted for depositing an adhesive on predetermined regions, i.e., on lead attaching regions of the chip active surface in the wafer level. Among them, a spin coating technique makes a dot of liquid adhesive to be dropped on the wafer surface and turns the wafer at a high revolution speed so that the liquid adhesive is uniformly spread on the wafer surface. Though the spin coating technique has an advantage that the coating of the adhesive is quickly accomplished, the electrode pads must be laboriously opened after the adhesive is cured, because the adhesive is coated on the entire wafer surface. However, in order to ensure the stable bonding between the semiconductor chip and the lead frame and to protect the chip active surface during the die bonding step, it is required to deposit an adhesive layer having a thickness over 30 micro-meters. As a result, the etching process for opening the electrode pads is time consuming. Moreover, the thick adhesive layer wastefully coated on the entire wafer surface may lower the reliability due to TCE mismatch with other materials such as the silicon chip and package body.

Figure 5:
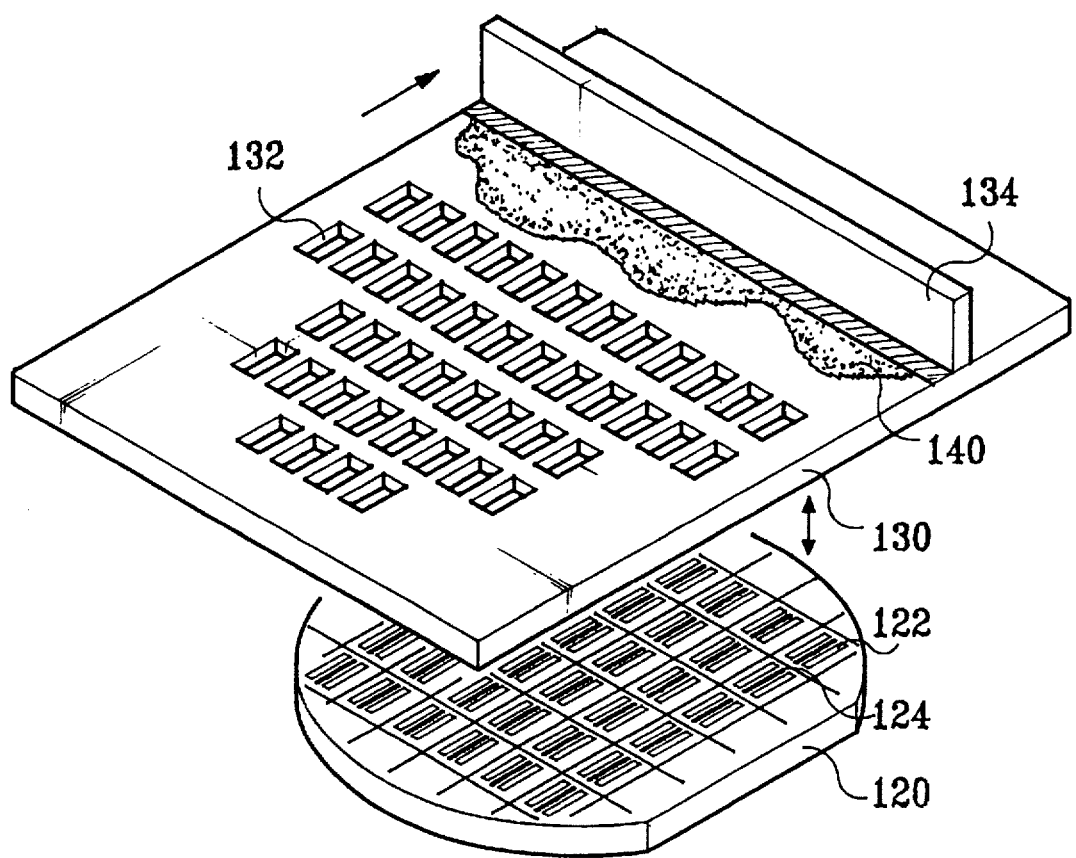
FIG. 5 is a perspective view for illustrating a screen printing method for depositing an insulating liquid adhesive material on the active surfaces of the chips in wafer state.

FIG. 5 is a perspective view for showing a screen printing method. A metal foil screen 130 has through hole patterns through which a liquid adhesive 140 is deposited on lead attaching regions formed on the chip active surface on a wafer 120. The screen 130 also has align keys (not shown) for exact alignment with the wafer 120. After the alignment, the screen 130 is contacted to the wafer upper surface. At this time, the lead attaching regions 122 on the wafer are exposed by the patterns 132. While providing a liquid adhesive 140 on the screen, the adhesive can be selectively deposited on the lead attaching regions by moving a squeegee 134 in a direction denoted by the arrow. When the adhesive deposition is completed, the screen is removed from the wafer surface, and the deposited adhesive is cured. The final structure is shown in FIGS. 6A and 6B.

Figure 6A:
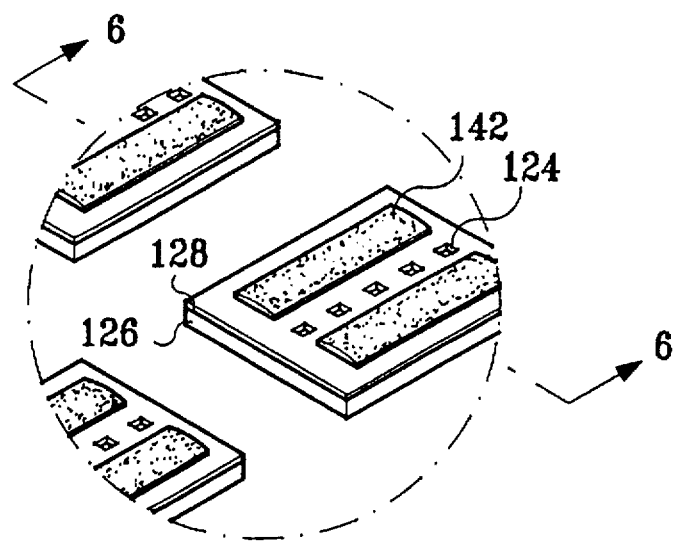
FIGS. 6A is a partial enlarged view of the semiconductor chip on which the adhesive is deposited by the screen printing method.
Figure 6B:
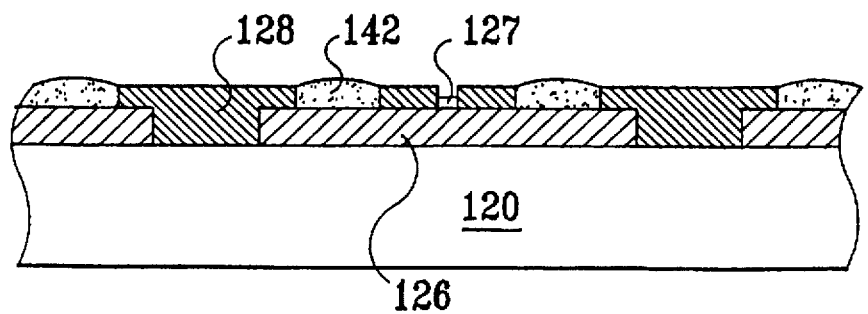
FIG. 6B is a cross sectional view of FIG. 6A taken along the line 6—6.

FIG. 6A is a partial enlarged view of the semiconductor chip 126 on which adhesive 142 is deposited by the screen printing method, and FIG. 6B is a cross sectional view of FIG. 6A taken along the line 6—6.

The adhesive is electrically insulating, and a polyimide, epoxy, polyimide siloxane or polyether amide may be selected as such an insulating adhesive. The working properties of the adhesive such as viscosity, thixotropy and cure time are required to be as consistent as possible. In the case of an epoxy adhesive, the cure time is somewhat high.

While the screen printing method allows the adhesive to be applied to many lead attaching regions at one time, the adhesive used for this process must be able to withstand long periods of working time on the screen so that neither frequent screen changes nor cleaning is required. The adhesive must be carefully designed to function well on the screen without trapping excessive air or causing stringing.

With the screen printing, the shape and the size of the deposited adhesive can be easily controlled by changing the through hole patterns of the screen so that such problems as occurred from the use of the conventional polyimide adhesive tape can be avoided in the LOC type package. When a single screen is successively applied to several wafers, an adhesive part stained on the screen back surface must be eliminated. And, the wafer must be carefully handled in subsequent assembly processes, because the deposited adhesive layer inevitably forms a nonplanar wafer surface which may cause breakage of the wafer in a tape mounting step to the back surface of the wafer.

Figure 7:
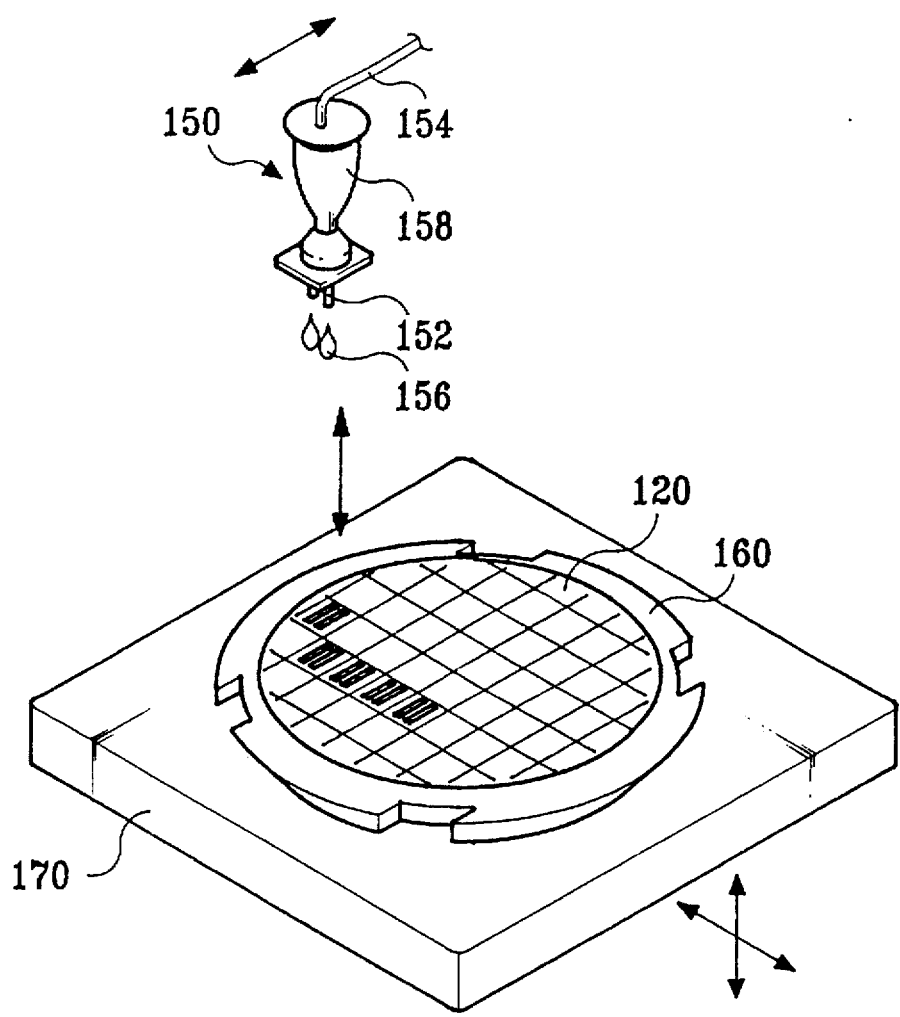
FIG. 7 is a perspective view for illustrating a dispensing method depositing an insulating liquid adhesive material on the active surfaces of the chips in wafer state.

FIG. 7 is a perspective view for illustrating the adhesive deposition using a dispensing method. The wafer 120 supported by a wafer ring 160 is mounted on an xy-table 170 movable in both x- and y-directions. A dispensing head 150 comprises a tube 154 for supplying a liquid adhesive 156, a syringe 158 for containing a certain amount of adhesive, and a number of needles 152 for dispensing the adhesive on the wafer 120.

As explained before, the adhesive may be an insulating material such as a polyimide, epoxy, polyimide siloxane and polyether amide. The locations of the lead attaching regions of the chip active surface can be recognized by, for example, an optical system (not shown). This recognition data can be used to control a driving tool such as a pulse motor or a servo motor of the xy-table 170 and to align the dispensing head. At the correct location, the dispensing head is lowered to the wafer surface, a pulse of air forces a dot of the liquid adhesive from the needle tips to be deposited on lead attaching regions of one semiconductor chip. The dispensing head moves up and the next semiconductor chip is aligned by moving the xy-table 170. Air pressure can be used for controlling the dispensing rate of the adhesive through the needle.

In the meantime, if the lead attaching regions 124 are made to have a grooved shape as explained before with reference to FIG. 4C, it is possible to prevent the overflow of the dispensed adhesive.

With the dispensing method, more stable manipulation of the wafer is realized, regardless of the size or the thickness of the wafer, than in the screen printing method, because the adhesive deposition is accomplished without contact between the dispensing head and the wafer surface. Further, the adhesive dispensing locations, and the dimensions such as width, length and thickness of the deposited adhesive are easily controlled by changing the diameter of the needle, the moving speed of the dispensing head, and by regulating the air pressure. Accordingly, the LOC type package can be optimized with respect to its structure and reliability.

Figure 8A:
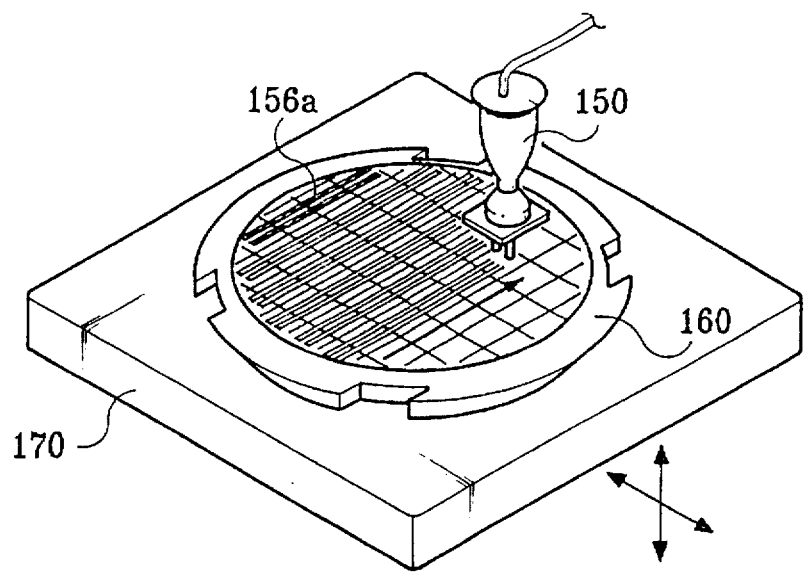
FIGS. 8A and 8B shows other embodiments of the dispensing method of the present invention.
Figure 8B:
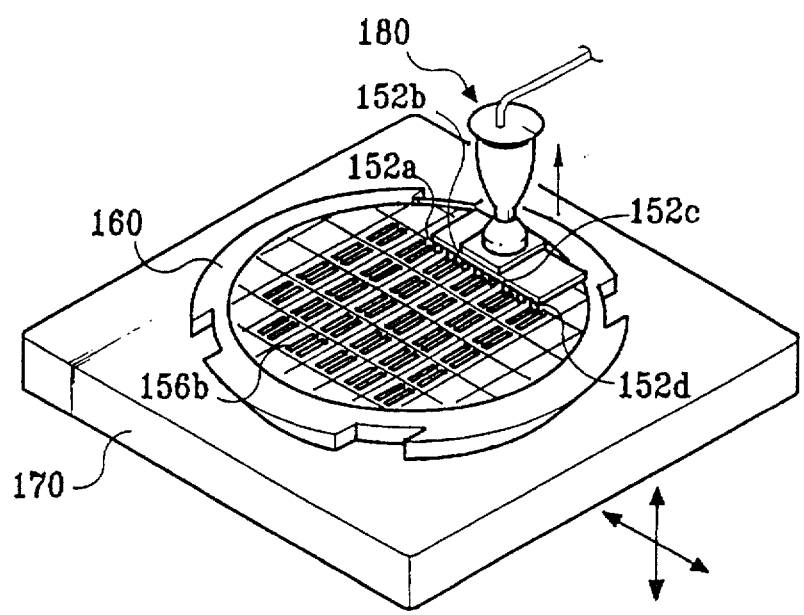

While the dispensing technique explained so far has been applied to one chip at a time, it is also possible to dispense the insulating adhesive on several chips in a mass or simultaneous manner. For example, as shown in FIG. 8A, once the dispensing head 150 is lowered, it runs from one end of the wafer to the other so that the adhesive is dispensed in a long line form as denoted by reference numeral 156a. Or if multiple needles 152a to 152d are equipped in a single dispensing head 180 as shown in FIG. 8B, the adhesive can be simultaneously deposited on the lead attaching regions of several semiconductor chips. This simultaneous dispensing technique can guarantee the uniform thickness of the adhesive for all chips in a wafer. Even though the adhesive is dispensed and cured in the long line form, neighboring chips can be easily separated with no problem, since a scribe such as a diamond wheel rotating at a high revolution speed is used in the wafer sawing step.

The adhesive dispensing can be carried out by using a unique dispensing machine. Such a machine comprises a driving tool for moving a table mounting the wafer in x- and y-directions, and a location recognition system for an exact alignment of the dispensing head with the lead attaching regions of the chip active surface. In the meantime, a conventional die bonding machine is provided with an xy-table which can move the mounted wafer and an optical system for selecting a particular chip from the wafer. Therefore, it is expected that if the dispensing head is incorporated in the conventional die bonding machine, time and cost for the unique dispensing machine can be saved.

Figure 9:
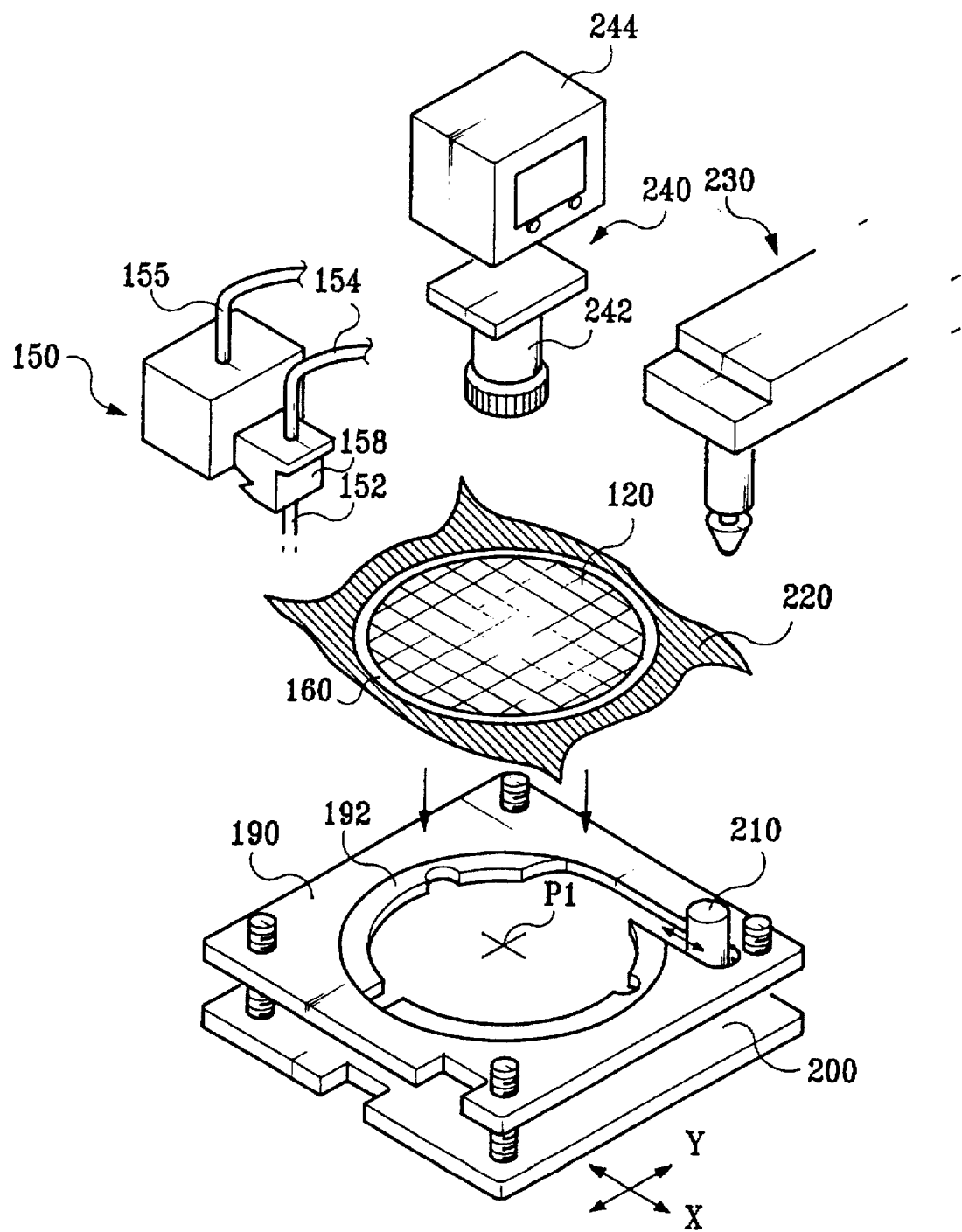
FIG. 9 is a schematic diagram of a die bonding machine provided with a dispensing head.

FIG. 9 is a schematic diagram of a die bonding machine provided with a dispensing head 150. The wafer 120 fixed to a wafer ring 160 has passed the steps of wafer fabrication (100 of FIG. 3), passivation layer formation 102, and electrode pad openings 103, and further passed a wafer back lapping, protective tape mounting and wafer sawing (i.e., a scribing) steps. Though the wafer 120 is scribed into individual semiconductor chips, the chips are supported by the protective tape 220. When the tape 220 is expanded by a ring 192 with the wafer 120 mounted on an expanding table 190, the scribed chips are separated from each other by a certain distance. The expanding table 190 is coupled to xy-table 200 that is movable in x- and y-directions. Optical system 240 has a camera 242, e.g., a CCD (Charge Coupled Device) camera, and a monitor 244. The camera 242 picks up the locations of the chips arranged in the wafer 120 and delivers the location information to the monitor 244. The monitor 244 can display the chip locations, and the location information is used to control a driving motor (not shown) for driving the xy-table 200 as well as to align pick-up tool 230 and dispensing head 150 with the wafer.

After the tape expanding is completed, the dispensing head 150 is placed over and aligned with the wafer 120. The insulating liquid adhesive contained in the syringe 158 is forced through the needles 152 on the lead attaching regions under the control of the air pressure from the air supply tube 155. The dispensing can be applied to the semiconductor chips in turn or in a lump to several chips.

Generally, defective chips on the wafer are identified with ink dots during EDS (Electrical Die Sorting) tests. When the dispensing method in which each semiconductor chip of a wafer is optically recognized is employed in the adhesive deposition, the adhesive is only deposited on nondefective functional chips, thus preventing adhesive waste.

After the adhesive dispensing and curing, an ejector 210 having sharp ended eject pins (not shown) moves toward a position P1, and pushes up a selected chip to completely separated the tape 220 from the wafer 120. The separated chip is transferred to a die bonding position by the pick-up tool 230.

Figure 10:
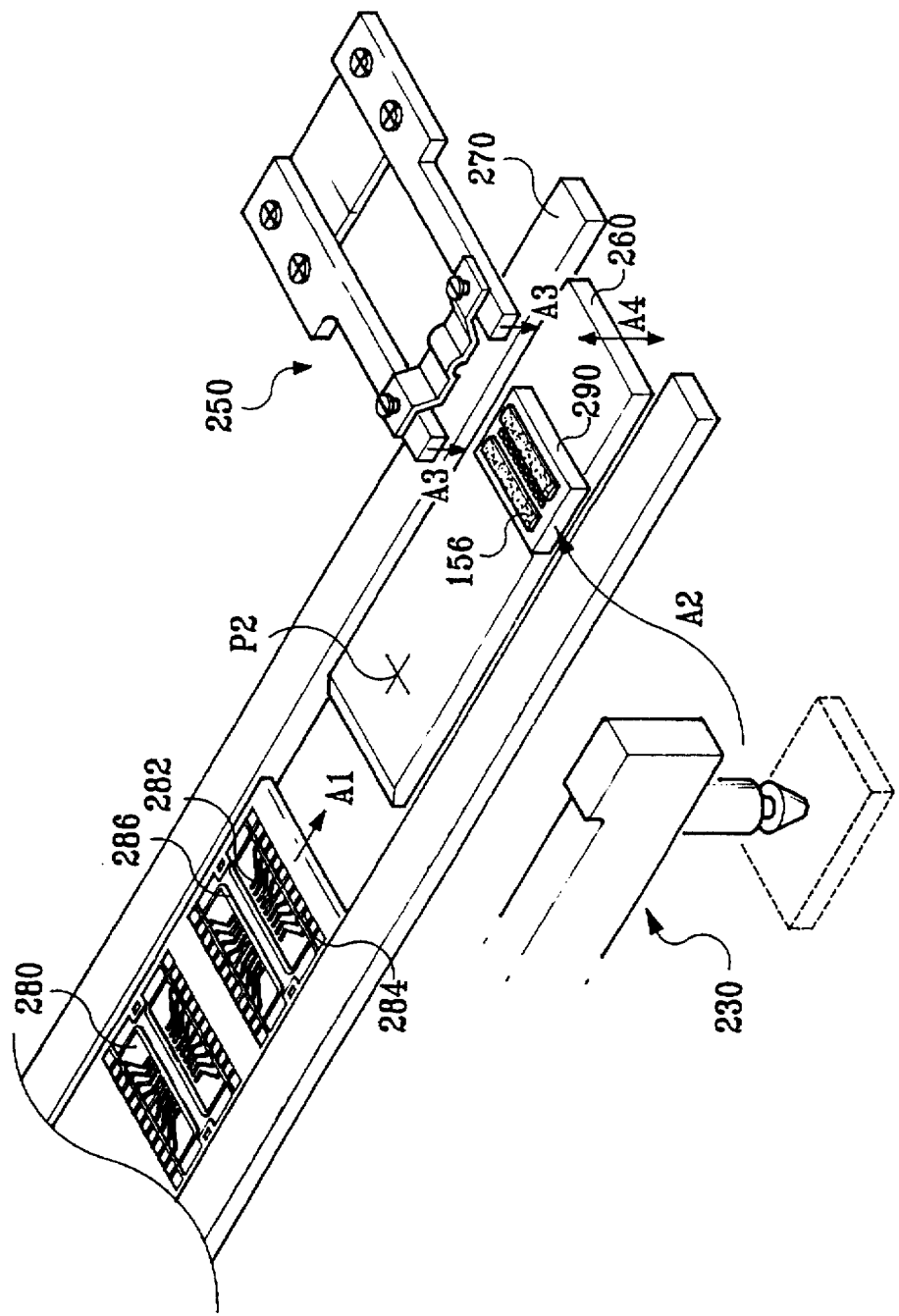
FIG. 10 is a partial schematic view for illustrating the process of die bonding individual semiconductor chip separated from a wafer to a lead frame.

FIG. 10 is a partial schematic view for illustrating the process of die bonding the separated chip to a lead frame. A lead frame 280 moves along guide rail 270 in a direction denoted by the arrow A1. The lead frame 280 has inner leads 282, outer leads 284 and bus bars 286, and the inner lead and bus bar portions are to be bonded to the separated chip 290 by using the adhesive 156 deposited according to the present invention onto the active surface of the chip 290.

The pick-up tool 230 carries the separated semiconductor chip 290 along A2, and then places the chips on a die bonding position of a heat block 260. The heat block 260 can move up and down as denoted by arrow A4. When the lead frame arrives at the die bonding position, die bonding head 250 and the heat block thermo-compress the lead frame leads and the chip active surface. For the conventional standard package device, an adhesive such as a silver epoxy would be dotted on a lead frame pad at a position P2, but in the LOC type package of the present invention the adhesive 156 has been already formed on the lead attaching regions of the chip active surface.

The foregoing disclosure and description of the present invention are illustrative and explanatory of the preferred embodiments, and therefore revisions and modification of the embodiments without departing from the scope and the spirit of the present invention will be possible by those who have ordinary skill in the art.

What is claimed is:

1. A method for manufacturing a lead-on-chip type semiconductor chip package, said method comprising steps of:

providing a wafer having an upper surface where a plurality of semiconductor chips are formed, each of said plurality of semiconductor chips having an active surface where a plurality of electrode pads are centrally disposed;

depositing a protection layer on the upper surface of the wafer;

depositing an insulating adhesive on lead attaching regions located at both sides of the centrally disposed electrode pads;

separating said plurality of semiconductor chips from the wafer;

performing a die bonding step for attaching an inner lead portion of a lead frame to the lead attaching regions by using the deposited insulating adhesive, said lead frame having leads for supporting the plurality of separated semiconductor chips and for electrically interconnecting the plurality of separated semiconductor chips to an external circuit device;

electrically interconnecting the inner lead portion of the lead frame to the plurality of electrode pads of the separated semiconductor chip; and forming a protective package body.

2. The method for manufacturing a lead-on-chip type semiconductor chip package as claimed in claim 1, wherein after said step of depositing the protection layer, further comprising the step of creating openings in the protection layer for exposing the plurality of electrode pads and lead attaching regions.

3. The method for manufacturing a lead-on-chip type semiconductor chip package as claimed in claim 1, wherein said step of depositing the protection layer comprises the sub-steps of: spin coating a liquid polyimide on the upper surface of the wafer; providing a photo-mask having patterns of the electrode pads and lead attaching regions; depositing a photoresist onto the coated polyimide; exposing and developing the photoresist by using the photo-mask; and etching and opening the electrode pads and the lead attaching regions.

4. The method for manufacturing a lead-on-chip type semiconductor chip package as claimed in claim 1, wherein said step of electrically interconnecting the inner lead portion of the lead frame to the plurality of electrode pads utilizes a wire bonding technique.

5. The method for manufacturing a lead-on-chip type semiconductor chip package as claimed in claim 1, wherein said insulating adhesive is selected from a group consisting of polyimide, epoxy, polyimide siloxane and polyether amide.

6. The method for manufacturing a lead-on-chip type semiconductor chip package as claimed in claim 1, wherein said step of depositing the insulative adhesive comprises the sub-steps of:

providing a metal screen having a through hole pattern corresponding to the lead attaching regions;

aligning and adhering the metal screen to the upper surface of the wafer;

forcing a liquid adhesive through the through hole pattern of the metal screen on the lead attaching regions of the semiconductor chips;

removing the metal screen from the wafer; and curing the deposited liquid adhesive on the lead attaching regions.

7. The method for manufacturing a lead-on-chip type semiconductor chip package as claimed in claim 2, wherein said step of depositing the insulative adhesive comprises the sub-steps of:

providing a metal screen having a through hole pattern corresponding to the lead attaching regions;

aligning and adhering the metal screen to the upper surface of the wafer;

forcing a liquid adhesive through the through hole pattern of the metal screen on the lead attaching regions exposed from the protection layer of the semiconductor chips;

removing the metal screen from the wafer; and curing the deposited liquid adhesive on the lead attaching regions.

8. The method for manufacturing a lead-on-chip type semiconductor chip package as claimed in claim 1, wherein said step of depositing the insulative adhesive comprises the substeps of:

mounting the wafer on an xy-table movable in x and y-directions;

aligning a dispensing head on the wafer, said dispensing head comprising an adhesive supply tube, a syringe containing a certain amount of liquid adhesive from the adhesive supply tube, and a needle through which the adhesive is dispensed;

dispensing the liquid adhesive on the lead attaching regions of the semiconductor chip on the wafer; and curing the dispensed adhesive.

9. The method for manufacturing a lead-on-chip type semiconductor chip package as claimed in claim 8, wherein said lead attaching regions of the semiconductor chips have a grooved shape formed by selectively removing the protection layer.

10. The method for manufacturing a lead-on-chip type semiconductor chip package as claimed in claim 8, wherein the dispensing of the liquid adhesive through the needle is applied to the plurality of semiconductor chips on the wafer in step-by-step manner.

11. The method for manufacturing a lead-on-chip type semiconductor chip package as claimed in claim 8, wherein the dispensing of the liquid adhesive through the needle is applied at a time to a plurality of semiconductor chips located in a same row or column on the wafer.

12. The method for manufacturing a lead-on-chip type semiconductor chip package as claimed in claim 8, wherein the dispensing head comprises a plurality of needles, and the dispensing of the adhesive through the plurality of needles is simultaneously applied to several semiconductor chips.

13. The method for manufacturing a lead-on-chip type semiconductor chip package as claimed in claim 8, wherein said insulating adhesive is selected from a group consisting of polyimide, epoxy, polyimide siloxane and polyether amide.

14. The method for manufacturing a lead-on-chip type semiconductor chip package as claimed in claim 1, wherein prior to the step of depositing the insulative adhesive on the lead attaching regions, are comprised a tape mounting step for mounting a protective tape onto a back side of the wafer and a scribing step for scribing the tape mounted wafer in scribe lines defined between neighboring semiconductor chips on the wafer, and wherein said step of depositing the insulative adhesive comprises the sub-steps of: mounting the wafer on an xy-table movable in x and y-directions; aligning a dispensing head on the wafer, said dispensing head comprising an adhesive supply tube, a syringe containing a certain amount of liquid adhesive from the adhesive supply tube, and a needle through which the adhesive is dispensed; dispensing the liquid adhesive on the lead attaching regions of the semiconductor chip on the wafer; and curing the dispensed adhesive.

15. The method for manufacturing a lead-on-chip type semiconductor chip package as claimed in claim 14, wherein said chip separating step pushes up a certain selected semiconductor chip from the wafer mounted on the xy-table so that the selected semiconductor chip is detached from the protective tape on the back side of the wafer.

16. The method for manufacturing a lead-on-chip type semiconductor chip package as claimed in claim 14, wherein said step of dispensing the liquid adhesive comprises the steps of recognizing identification marks on the semiconductor chips on the wafer and of selectively dispensing the liquid adhesive on semiconductor chips which do not have the identification marks.

* * * * *